(12) United States Patent  
Marimuthu et al.

(10) Patent No.: US 7,851,257 B2
(45) Date of Patent: Dec. 14, 2010

(54) INTEGRATED CIRCUIT STACKING SYSTEM WITH INTEGRATED PASSIVE COMPONENTS

(75) Inventors: Pandi Chelvam Marimuthu, Singapore (SG); Robert Charles Frye, Piscataway, NJ (US); Yaojian Lin, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1043 days.

(21) Appl. No.: 11/538,806

(22) Filed: Oct. 4, 2006

(65) Prior Publication Data

US 2007/0114651 A1 May 24, 2007

Related U.S. Application Data

(60) Provisional application No. 60/596,925, filed on Oct. 29, 2005.

(51) Int. Cl.
*H01L 21/00* (2006.01)
*H01L 21/8234* (2006.01)
*H01L 21/8244* (2006.01)
*H01L 23/02* (2006.01)
*H01L 23/34* (2006.01)

(52) U.S. Cl. .............. 438/108; 438/118; 438/238; 438/382; 438/393; 257/724; 257/678

(58) Field of Classification Search .............. 438/108, 438/118, 238, 382, 393
See application file for complete search history.

(56) References Cited

U.S. PATENT DOCUMENTS

| | | |
|---|---|---|
| 5,370,766 A | 12/1994 | Desaigoudar et al. |
| 5,446,311 A | 8/1995 | Ewen et al. |
| 5,478,773 A | 12/1995 | Dow et al. |
| 6,075,427 A | 6/2000 | Tai et al. |
| 6,180,445 B1 | 1/2001 | Tsai |
| 6,294,420 B1 | 9/2001 | Tsu et al. |
| 6,534,374 B2 | 3/2003 | Johnson et al. |
| 6,636,139 B2 | 10/2003 | Tsai et al. |
| 6,761,963 B2 | 7/2004 | Casper et al. |
| 6,900,708 B2 | 5/2005 | White et al. |
| 6,933,614 B2 | 8/2005 | Lee et al. |
| 7,068,139 B2 | 6/2006 | Harris et al. |
| 7,084,515 B2 | 8/2006 | Fuller et al. |
| 2003/0219956 A1 | 11/2003 | Mori et al. |
| 2004/0007778 A1 | 1/2004 | Shinozaki et al. |
| 2005/0017361 A1 | 1/2005 | Lin et al. |
| 2005/0054155 A1 | 3/2005 | Song et al. |
| 2005/0093095 A1 | 5/2005 | Yamagata |
| 2005/0127393 A1 | 6/2005 | Kurokawa |
| 2005/0212106 A1* | 9/2005 | Kwon et al. ............ 257/678 |
| 2005/0253255 A1* | 11/2005 | Degani et al. ............ 257/724 |
| 2007/0231251 A1* | 10/2007 | Itsuki et al. ............ 423/608 |
| 2007/0235878 A1 | 10/2007 | Lin et al. |

* cited by examiner

*Primary Examiner*—Ha Tran T Nguyen
*Assistant Examiner*—Valerie Brown
(74) *Attorney, Agent, or Firm*—Mikio Ishimaru

(57) ABSTRACT

An integrated circuit stacking system is provided including fabricating an integrated passive device including: providing a semiconductor substrate, forming an integrated inductor, a resistor block, or an integrated capacitor integrated on the semiconductor substrate, and forming contact pads, on the semiconductor substrate, coupled to the integrated inductor, the resistor block, or the integrated capacitor; positioning an integrated circuit die for maintaining an inductor spacing; mounting the integrated circuit die on the integrated passive device; and encapsulating the integrated circuit die and the integrated passive device.

20 Claims, 6 Drawing Sheets

INTEGRATED CIRCUIT STACKING SYSTEM WITH INTEGRATED PASSIVE COMPONENTS

CROSS-REFERENCE TO RELATED APPLICATION(S)

This application claims the benefit of U.S. Provisional Patent Application Ser. No. 60/596,925 filed Oct. 29, 2005.

The present application contains subject matter related to co-pending U.S. patent application Ser. No. 11/278,002 by Yaojian Lin and Pandi Chelvam Marimuthu entitled "Integrated Circuit Package System with Post-Passivation Interconnection and Integration". The related application is assigned to STATS ChipPAC Ltd.

TECHNICAL FIELD

The present invention relates generally to integrated circuits and more particularly to integrated circuit packaging.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large scale integration have underscored the need for back-end semiconductor manufacturing to provide more solutions involving the integrated circuit itself. Numerous technologies have been developed to meet these requirements. Some of the research and development strategies focus on new package technologies while others focus on improving the existing and mature package technologies. Both approaches may include additional processing of the integrated circuits to better match the targeted package.

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Numerous integrated circuit designs are aimed for mixed-signal designs by incorporating analog functions. One of the major challenges in the creation of analog processing circuitry (using digital processing procedures and equipment) is that a number of the components that are used for analog circuitry are large in size and are therefore not readily integrated into integrated circuits. The main components that offer a challenge in this respect are capacitors and inductors, since both these components are, for typical analog processing circuits, of considerable size. In response to the demands for improved package performance and analog circuitry integration, packaging manufacturers may prepare the integrated circuit for packaging as well as provide analog circuitry integration onto the integrated circuit.

With the rapid migration of on-chip interconnect from aluminum (Al) to copper (Cu), the demand for off-chip interconnects is increasing. The conventional gold wire bonding technologies are facing challenges with bare copper pads because pad oxidation inhibits a mature bonding process.

With the increase in integration and shrinking geometries, has come a massive increase in frequencies that the integrated circuit must deal with. Many of the latest digital circuits require a phase lock loop (PLL) to stay synchronized with other signaling devices. The discrete analog components, required for some of the higher frequencies, are extremely large when compared to the digital logic that they support. In order to satisfy the demand for these necessary components, semiconductor technologies have added additional layers and special processing that increase cost and reduce the overall yield.

Thus, a need still remains for an integrated circuit package system with post-passivation interconnection and integration providing low cost manufacturing, improved yields, reduce the integrated circuit package dimensions, and provide flexible connectivity and integration configurations. In view of the ever-increasing need to save costs and improve efficiencies, it is more and more critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit stacking system including fabricating an integrated passive device including: providing a semiconductor substrate, forming an integrated inductor, a resistor block, or an integrated capacitor integrated on the semiconductor substrate, and forming contact pads, on the semiconductor substrate, coupled to the integrated inductor, the resistor block, or the integrated capacitor; positioning an integrated circuit die for maintaining an inductor spacing; mounting the integrated circuit die on the integrated passive device; and encapsulating the integrated circuit die and the integrated passive device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
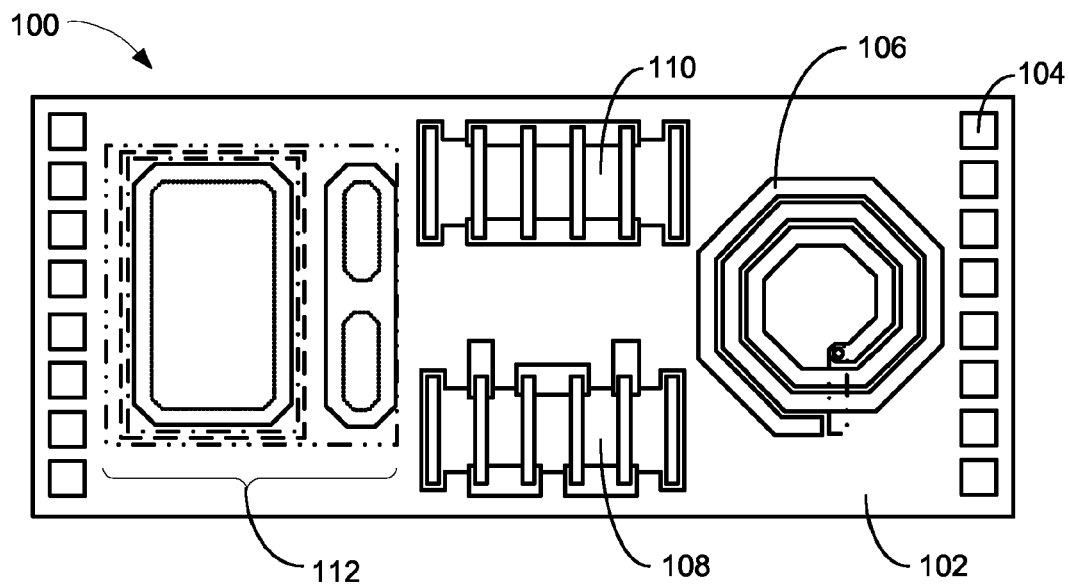
FIG. 1 is a top plan view of an integrated circuit stacking system with passive components, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a top plan view of an integrated circuit stacking system 100 with passive components, in an embodiment of the present invention. The top plan view of the integrated circuit stacking system 100 depicts a semiconductor substrate 102, having contact pads 104 that support interconnection of an integrated inductor 106, a first resistor block 108, a second resistor block 110 or an integrated capacitor 112.

The semiconductor substrate 102, such as a silicon substrate, may be configured with precision valued components and connected to implement functions that support a second integrated circuit. The substrate may be of any semiconductor geometry that will best support the required function. It as been discovered that the simplified construction of the integrated inductor 106 and the integrated capacitor 112 allow precision values of these devices to be readily produced in volume without impacting the yield of the integrated circuit that will use the function.

The number and orientation of the contact pads 104 is for example only, and it is understood that any number of the contact pads 104 may be arranged on the surface of the semiconductor substrate 102. Likewise, any number and size of the first resistor block 108, the second resistor block 110, the integrated capacitor 112, or the integrated inductor 106 may be implemented on the substrate. Many purely analog functions, such as voltage regulators, filters, phase lock loops, amplifiers, or detectors may be fabricated and interconnected through the semiconductor substrate 102. The semiconductor substrate 102 may be covered by a polyimide glass having a dielectric value (k) of less than 4.

Figure 2:
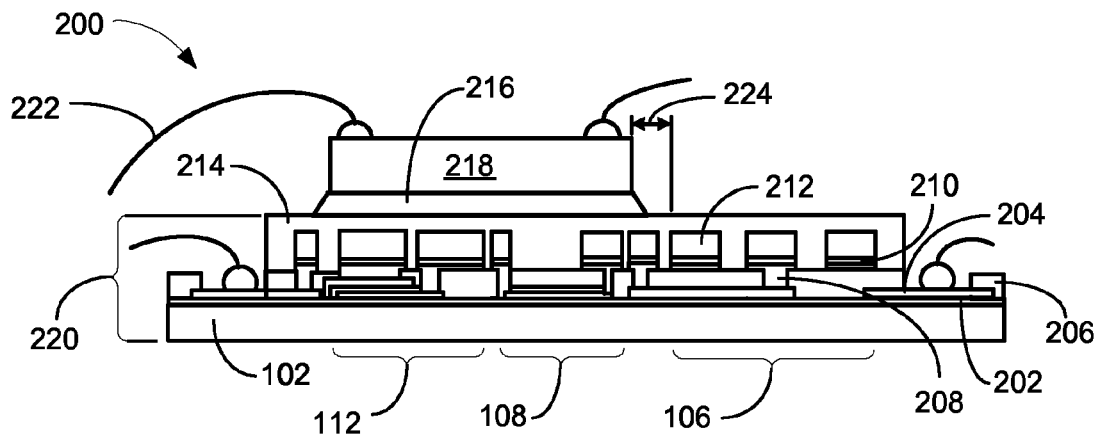
FIG. 2 is a cross-sectional view of an integrated circuit stacking system, using an integrated passive device structure.

Referring now to FIG. 2, therein is shown a cross-sectional view of an integrated circuit stacking system 200, using an integrated passive device structure. The cross-sectional view of the integrated circuit stacking system 200 depicts the semiconductor substrate 102, a passivation layer 202, over the semiconductor substrate 102, a first metal layer 204, such as copper, on the passivation layer 202, and a first polyimide layer 206. The first polyimide layer 206 covers the first metal layer 204 structures of the integrated inductor 106, the first resistor block 108, and the integrated capacitor 112.

A via metal 208, such as titanium, connects the first metal layer 204 to a barrier layer 210. The barrier layer 210, such as nickel-vanadium (NiV), is a diffusion barrier to a second metal layer 212. The second metal layer, such as copper, forms the upper structure of the integrated inductor 106 and the integrated capacitor 112. A second polyimide layer 214 is thicker that the first polyimide layer 206. It encapsulates the structures of the integrated inductor 106, the first resistor block 108, and the integrated capacitor 112. An adhesive 216, such as a die attach material, is used to mount an integrated circuit die 218 over an integrated passive device 220. The integrated passive device 220 comprises all of the material assembled on the semiconductor substrate 102. An electrical interconnect 222, such as a bond wire, couples the integrated circuit die 218 to the next level of system (not shown).

An inductor spacing 224 is required to assure the proper operation of the integrated inductor 106. It was discovered that placing the integrated circuit die 218 over the integrated inductor 106 reduced the quality factor of the integrated inductor 106. In order to preserve that overall performance of the integrated inductor 106, the inductor spacing 224 must be maintained in the horizontal and the vertical planes.

Figure 3:
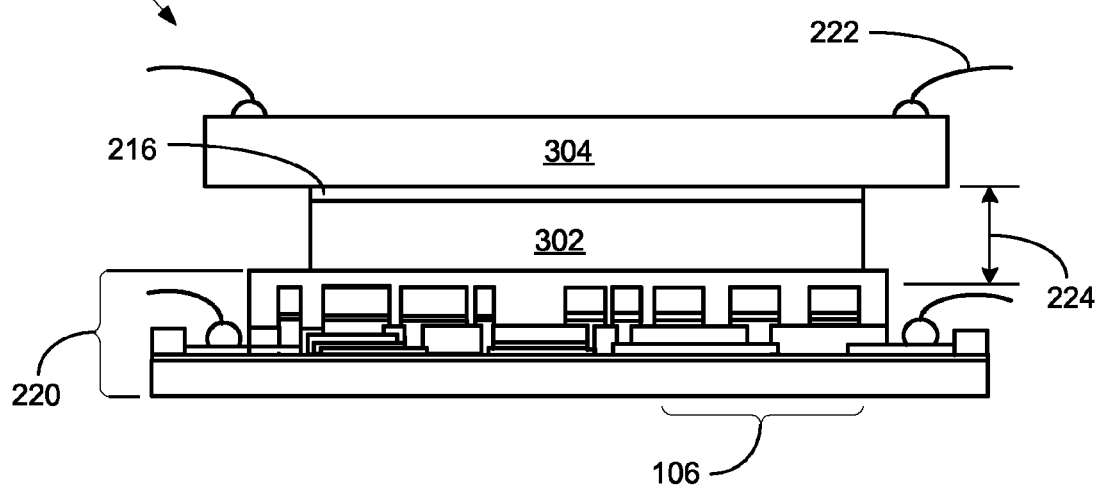
FIG. 3 is a cross-sectional view of an integrated circuit stacking system with the integrated passive device, in an alternative embodiment of the present invention.

Referring now to FIG. 3, therein is shown a cross-sectional view of an integrated circuit stacking system 300 with the integrated passive device, in an alternative embodiment of the present invention. The cross-sectional view of the integrated circuit stacking system 300 depicts a polyimide film spacer 302 mounted on the integrated passive device 220. The adhesive 216 may be used to adhere an integrated circuit 304 to the polyimide film spacer 302. The area of the integrated inductor 106 is directly below the integrated circuit 304. The performance of the integrated inductor 106 is preserved however, because the vertical spacing meets or exceeds the inductor spacing 224 requirement. The minimum distance required between the integrated inductor 106 and the integrated circuit 304 will be explained in a later figure. The electrical interconnect 222 is used to couple the integrated circuit 304 and the integrated passive device 220 to the next level system (not shown).

Figure 4:
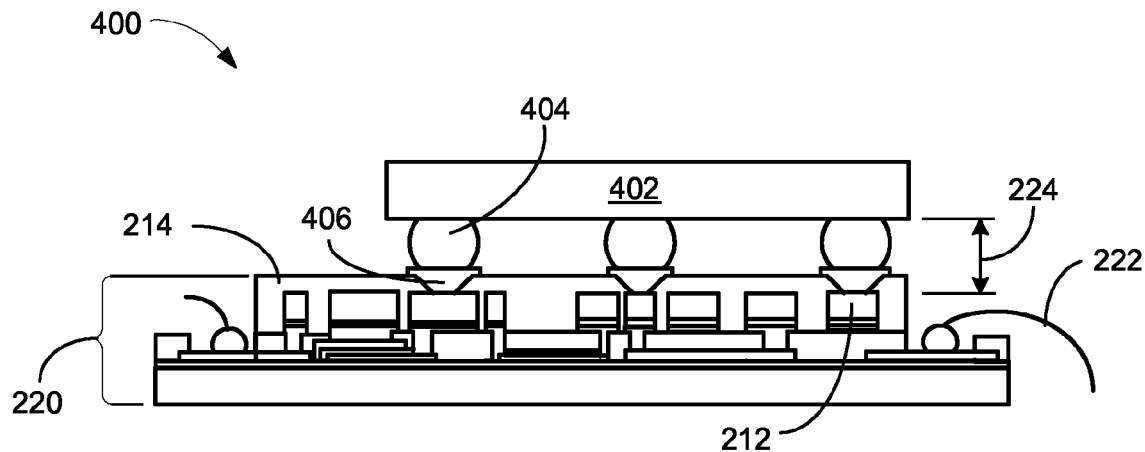
FIG. 4 is a cross-sectional view of an integrated circuit stacking system with passive components, in another alternative embodiment of the present invention.

Referring now to FIG. 4, therein is shown a cross-sectional view of an integrated circuit stacking system 400 with passive components, in another alternative embodiment of the present invention. The cross-sectional view of the integrated circuit stacking system 400 depicts the integrated passive device 220 having a flipchip integrated circuit 402 mounted thereon. The flipchip integrated circuit 402 may have electrical interconnects 404, such as solder balls, solder bumps, or stud bumps.

The second polyimide layer 214 has recesses opened above the second metal layer 212. An under bump material 406, such as copper, gold, or a conductive material, is electrically connected to the second metal layer 212. The electrical interconnect 222 is used to couple the integrated passive device 220 and the flipchip integrated circuit 402 to the next level system, such as a substrate or printed circuit board (not shown). The flipchip integrated circuit 402 is positioned over the integrated passive device 220, with the inductor spacing 224 between the devices.

Figure 5:
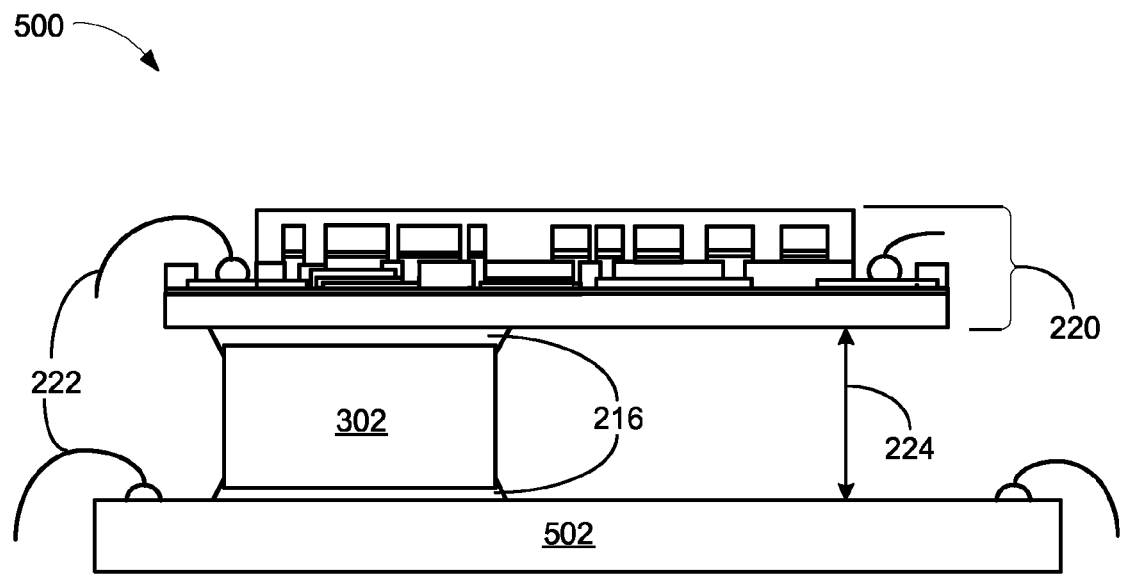
FIG. 5 is a cross-sectional view of an integrated circuit stacking system with passive components, in yet another alternative embodiment of the present invention.

Referring now to FIG. 5, therein is shown a cross-sectional view of an integrated circuit stacking system 500 with passive components, in yet another alternative embodiment of the present invention. The cross-sectional view of the integrated circuit stacking system 500 depicts an integrated circuit 502, such as the integrated passive device 220, having the polyimide film spacer 302 mounted by the adhesive 216. The opposite side of the polyimide film spacer 302 is mounted on the integrated passive device 220. The spacing between the devices meets the inductor spacing 224 in order to preserve the performance of the integrated inductor 106. The electrical interconnect 222 is used to connect the integrated circuit 502 and the integrated passive device 220 to the next level system or each other.

Figure 6:
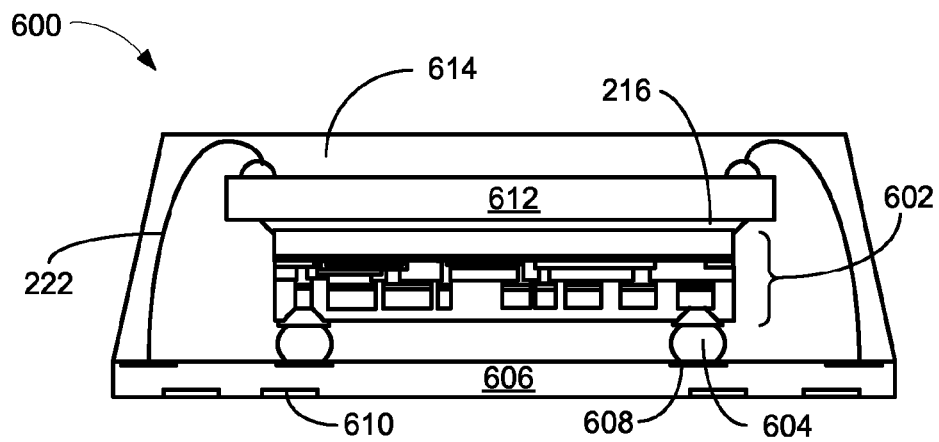
FIG. 6 is a cross-sectional view of an integrated circuit stacking system with passive components, in still another alternative embodiment of the present invention.

Referring now to FIG. 6, therein is shown a cross-sectional view of an integrated circuit stacking system 600 with passive components, in still another alternative embodiment of the present invention. The cross-sectional view of an integrated circuit stacking system 600 depicts an integrated passive device 602 having signal interconnects 604, such as solder balls, solder bumps, solder columns, or stud bumps. The integrated passive device 602 is mounted in an inverted position on a substrate 606, such as a ceramic substrate or printed circuit board. The substrate 606 has bond pads 608 on the top surface and solder pads 610 on the bottom surface.

An integrated circuit 612 is mounted, with the adhesive 216, above the integrated passive device 602. The electrical interconnect 222 couples the integrated circuit 612 to the substrate 606. A molded body 614, such as an epoxy molding compound, plastic, or ceramic, encapsulates the electrical interconnect 222, the integrated circuit 612, the integrated passive device 602, and the top surface of the substrate 606.

Figure 7:
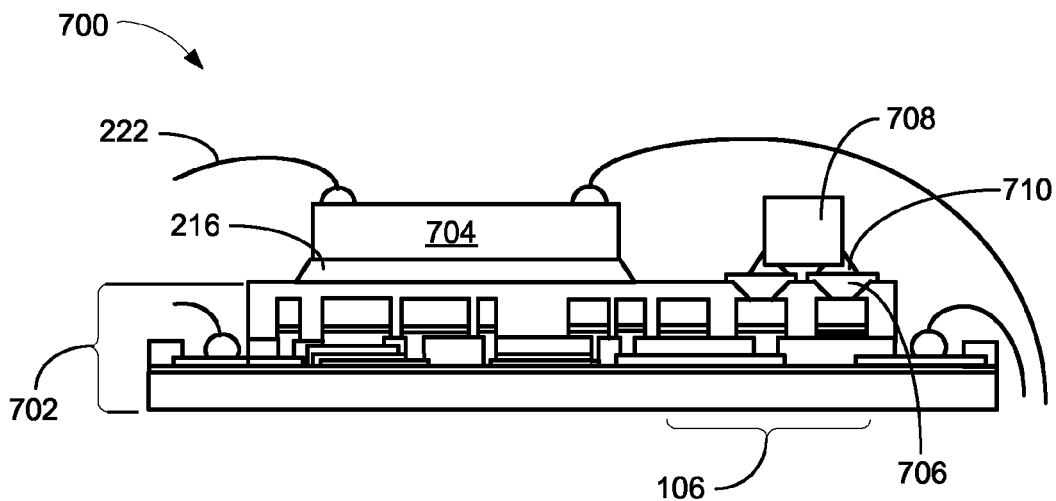
FIG. 7 is a cross-sectional view of an integrated circuit stacking system with passive components, in an alternative embodiment with discrete components.

Referring now to FIG. 7, therein is shown a cross-sectional view of an integrated circuit stacking system 700 with passive components, in an alternative embodiment with discrete components. The cross-sectional view of the integrated circuit stacking system 700 depicts the integrated passive device 702. An integrated circuit 704 is mounted on the top surface of the integrated passive device 702. The integrated circuit 704 is positioned to maintain a clearance over the integrated inductor 106.

An under bump contact 706 provides an electrical connection between a discrete device 708, such as an inductor, capacitor, or resistor, and the integrated inductor 106. The discrete device 708 may be a component having a value that would require too large a space in the integrated device 702. By providing the flexibility to incorporate the discrete device 708, difficult precision circuits can be developed in a minimum of space and reduced cost. An electrical bonding compound 710, such as solder, couples the discrete device 708 to the under bump contact 706. The electrical interconnect 222 is used to connect the integrated circuit 704 and the integrated passive device 702 to the next level system or each other.

Figure 8:
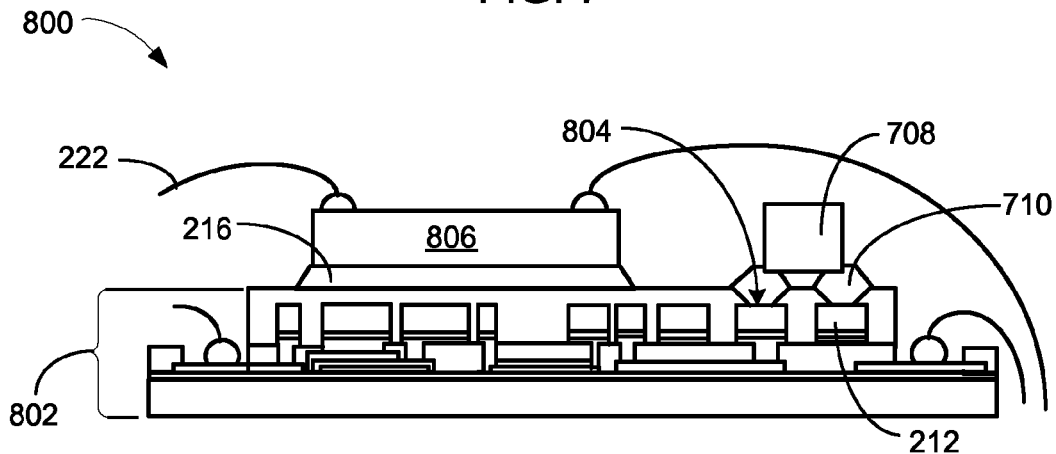
FIG. 8 is a cross-sectional view of an integrated circuit stacking system with passive components, in another alternative embodiment with discrete components.

Referring now to FIG. 8, therein is shown a cross-sectional view of an integrated circuit stacking system 800 with passive components, in another alternative embodiment with discrete components. The cross-sectional view of the integrated circuit stacking system 800 depicts an integrated passive device 802 having a solder wettable contact 804 on the second metal layer 212. The discrete device 708 may be attached by the electrical bonding compound 710. An integrated circuit 806 is mounted on the top surface of the integrated passive device 802, by the adhesive 216. The electrical interconnect 222 is used to connect the integrated circuit 806 and the integrated passive device 802 to the next level system or each other.

Figure 9:
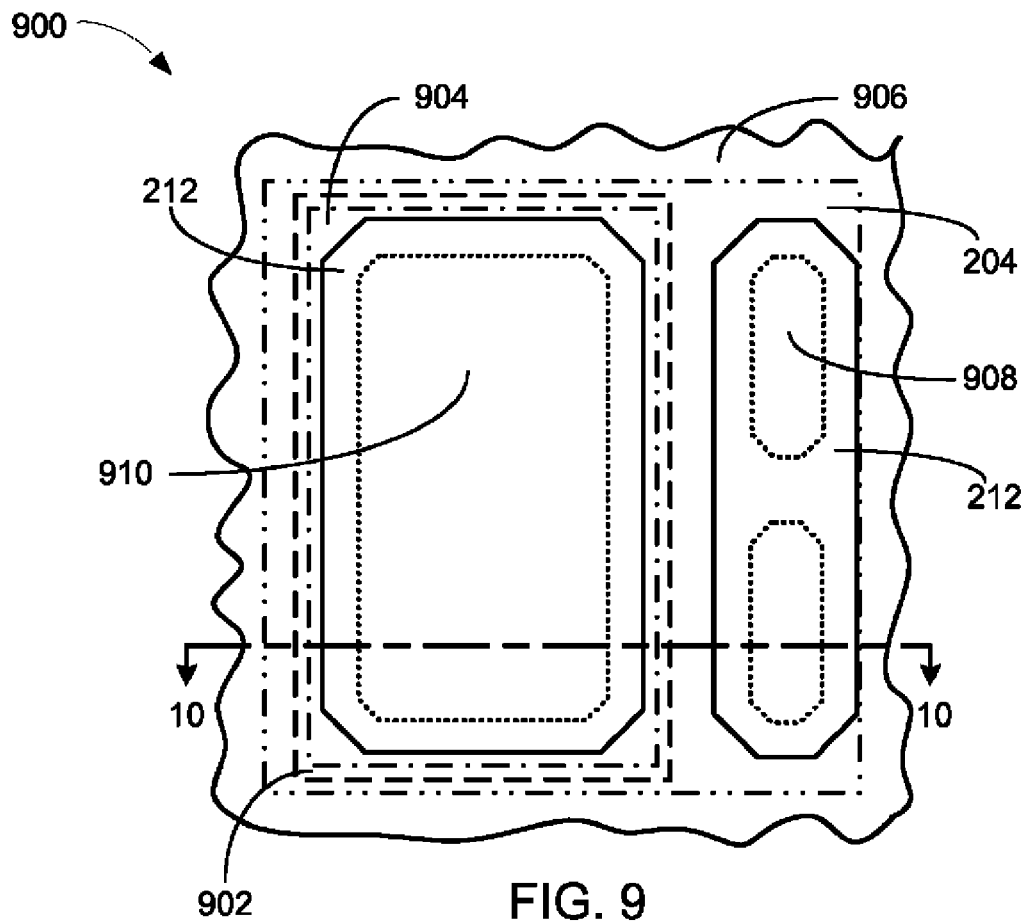
FIG. 9 is a partial plan view of an integrated capacitor, in an embodiment of the present invention.

Referring now to FIG. 9, therein is shown a partial plan view of an integrated capacitor 900, in an embodiment of the present invention. The partial plan view of the integrated capacitor 900 depicts the first metal layer 204, a silicide layer 902, such as tantalum-silicon (TaSi), is on the first metal layer 204. A nitride layer 904, such as SiN, is positioned on the silicide layer 902. A polyimide layer 906 covers the all of the previously mentioned layers and has a contact opening 908 and a capacitor opening 910. The contact opening 908 allows direct contact between the first metal layer 204 and the second metal layer 212. The value of the integrated capacitor 900 is determined by the thickness of the nitride layer 904 and the area of the capacitor opening 910. A typical value for the area of the capacitor opening 910 is 30 um by 30 um or larger. It has been discovered that this technique allows easy manufacturing of the integrated capacitor 900 with only two metal layers, while current technology requires three metal layers. The section line 10-10 indicates the area displayed in FIG. 10.

Figure 10:
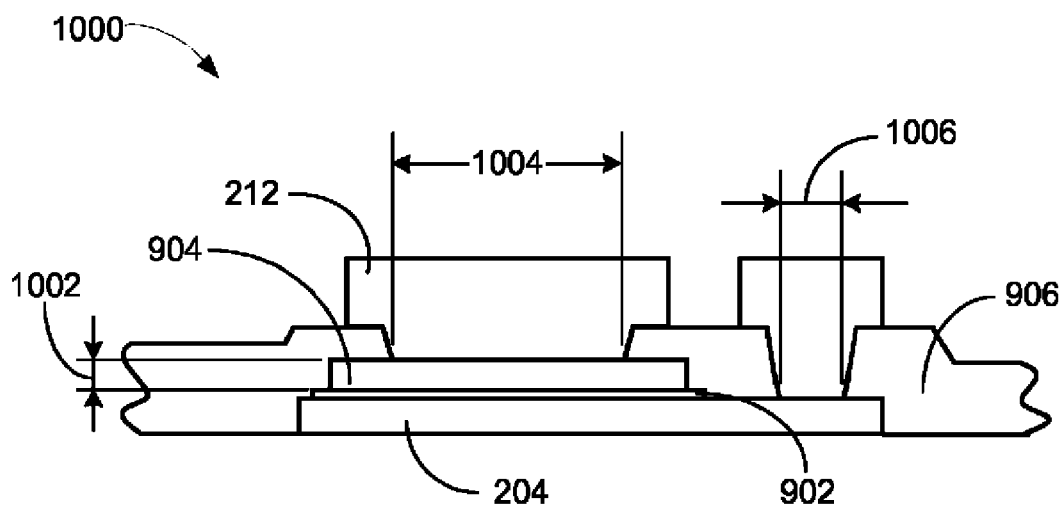
FIG. 10 is a partial cross-sectional view of the integrated capacitor, of FIG. 9, along the section line 10-10.

Referring now to FIG. 10, therein is shown a partial cross-sectional view of the integrated capacitor 900, of FIG. 9, along the section line 10-10. The partial cross-sectional view of the integrated capacitor 900 depicts the first metal layer 204, the silicide layer 902 on the first metal layer 204, and the dielectric layer 904, such as silicon nitride (SiN), having a thickness 1002. The polyimide layer 906 covers the first metal layer 204, the silicide layer 902 and the dielectric layer 904. The polyimide layer 906 has a capacitor opening 1004 and a contact opening 1006. The second metal layer 212 is deposited in both the capacitor opening 1004 and the contact opening 1006. The capacitance value is proportional to the area of the capacitor opening 1004. The actual capacitance value is determined by the thickness 1002 of the dielectric layer 904 and the area of the capacitor opening 1004. In this structure, the first metal layer 204 forms the first plate of the integrated capacitor 900 and the second metal layer 212 forms the second plate of the capacitor.

Figure 11:
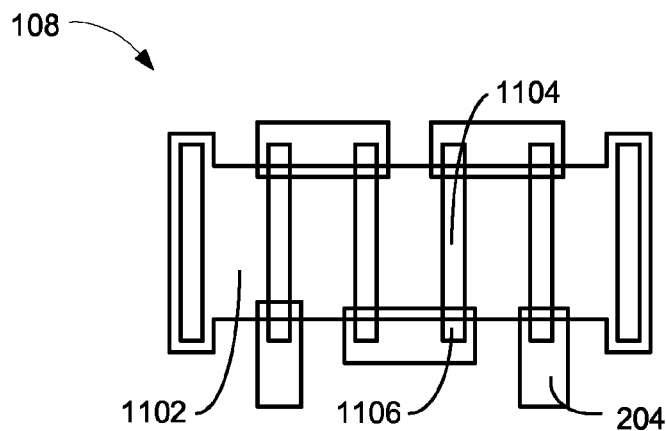
FIG. 11 is a plan view of the first resistor block connected in a series configuration.

Referring now to FIG. 11, therein is shown a plan view of the first resistor block 108 connected in a series configuration. The plan view of the first resistor block 108 depicts a dielectric layer 1102 formed in a "dog bone" configuration. The dog bone shape is a result of the design rules associated with the layout of the materials. The first metal layer 204 is used to form an interconnect path between a resistor stripe 1104 and additional circuitry (not shown). The resistor stripe 1104, such as a silicide (TaSi), is constructed across the width of the dielectric layer 1102. A typical resistor stripe 1104 has a width in the range of 10 to 20 microns. A metal contact 1106 couples the resistive stripe 1104 to the first metal layer 204. The metal contact 1106 is typically 20 microns wide.

Several of the resistor stripes 1104 are formed parallel to each other along the length of the dog bone shape of the dielectric layer 1102. By using the first metal layer 204 to interconnect only two of the endpoints of the resistor stripe 1104, a serial path is formed through the resistor stripes 1104. The result is a resistance value that is four times the value of a single unit of the resistor stripe 1104. The number of the resistor stripes 1104 shown in the figure is for example only. Any number of the resistor stripes 1104 may be formed in close configuration.

Figure 12:
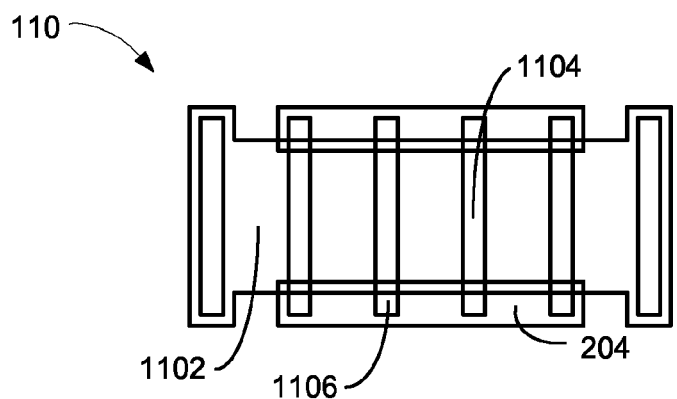
FIG. 12 is a plan view of the second resistor block connected in a parallel configuration.

Referring now to FIG. 12, therein is shown a plan view of the second resistor block 110 connected in a parallel configuration. The plan view of the second resistor block 110 depicts the dielectric layer 1102 formed in a "dog bone" configuration. The dog bone shape is a result of the design rules associated with the layout of the materials. The first metal layer 204 is used to form an interconnect path between the resistor stripe 1104 and additional circuitry (not shown). The resistor stripe 1104, such as a silicide (TaSi), is constructed across the width of the dielectric layer 1102. The typical resistor stripe 1104 has a width in the range of 10 to 20 microns. The metal contact 1106 couples the resistor stripe 1104 to the first metal layer 204. The metal contact 1106 is typically 20 microns wide.

Several of the resistor stripes 1104 are formed parallel to each other along the length of the dog bone shape of the dielectric layer 1102. By using the first metal layer 204 to interconnect four of the endpoints of the resistor stripe 1104, a parallel path is formed through the resistor stripes 1104. The result is a resistance value that is one fourth of the value of a single unit of the resistor stripe 1104. The number of resistor stripes 1104 shown in the figure is for example only. Any number of the resistor stripes 1104 may be formed in close configuration.

Figure 13:
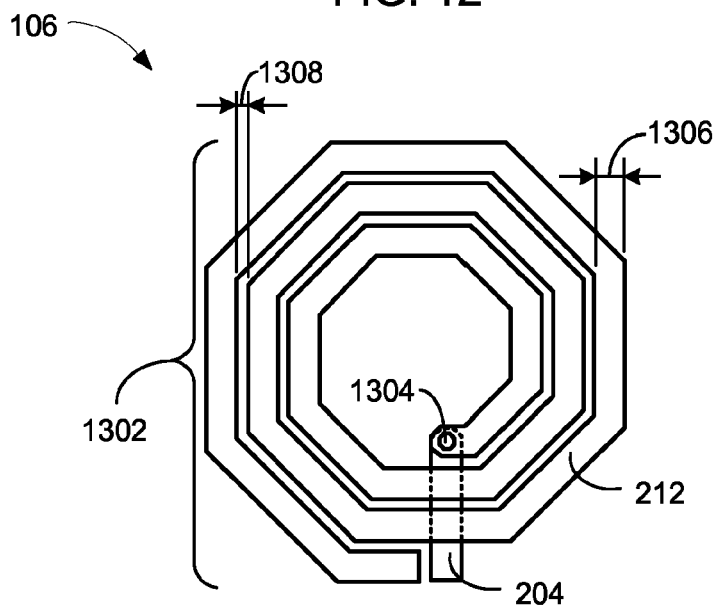
FIG. 13 is a plan view of the integrated inductor, in an embodiment of the present invention.

Referring now to FIG. 13, therein is shown is a plan view of the integrated inductor 106, in an embodiment of the present invention. The plan view of the integrated inductor 106 depicts a conductive coil 1302 formed of the second metal layer 212. A metal interconnect 1304 couples the conductive coil 1302 to the first metal layer 204 for connection to external circuitry (not shown). Typically a width 1306 of the second metal layer 212, that forms the conductive coil 1302, is in the range of 10 to 50 microns. A space 1308 between the turns of the conductive coil 1302 is approximately 10 microns.

It has been discovered that the quality factor (Q) of the integrated inductor 106 may be reduced if it is stacked too close to another substrate having a dielectric constant (K) greater than 11. The present invention uses material with dielectric constants of less than 4 with the inductor spacing (IS) 224, of FIG. 2, in all planes determined by equation 1 below:

$$IS = 2P = 2(W+S) \quad (1)$$

Where the inductor spacing (IS) 224 is determined as being two times the width 1306 plus the space 1308. In the application described above, the minimum value of the inductor spacing 224 would typically be between 3 and 4 mils. In the instances where nothing is positioned above the integrated inductor 106, the minimum spacing would be in the X and Y directions. If an object, such as the integrated circuit 304, is positioned above the integrated inductor 106, the minimum value of the inductor spacing 224 is measured in the Z direction.

The conductive coil 1302 of the integrated inductor 106 is shown having an octagon shape is but an example. The actual shape of the conductive coil may be round, ellipse, rectangular or any geometric shape that can repeat in a larger space with an equal spacing between loops.

Figure 14:
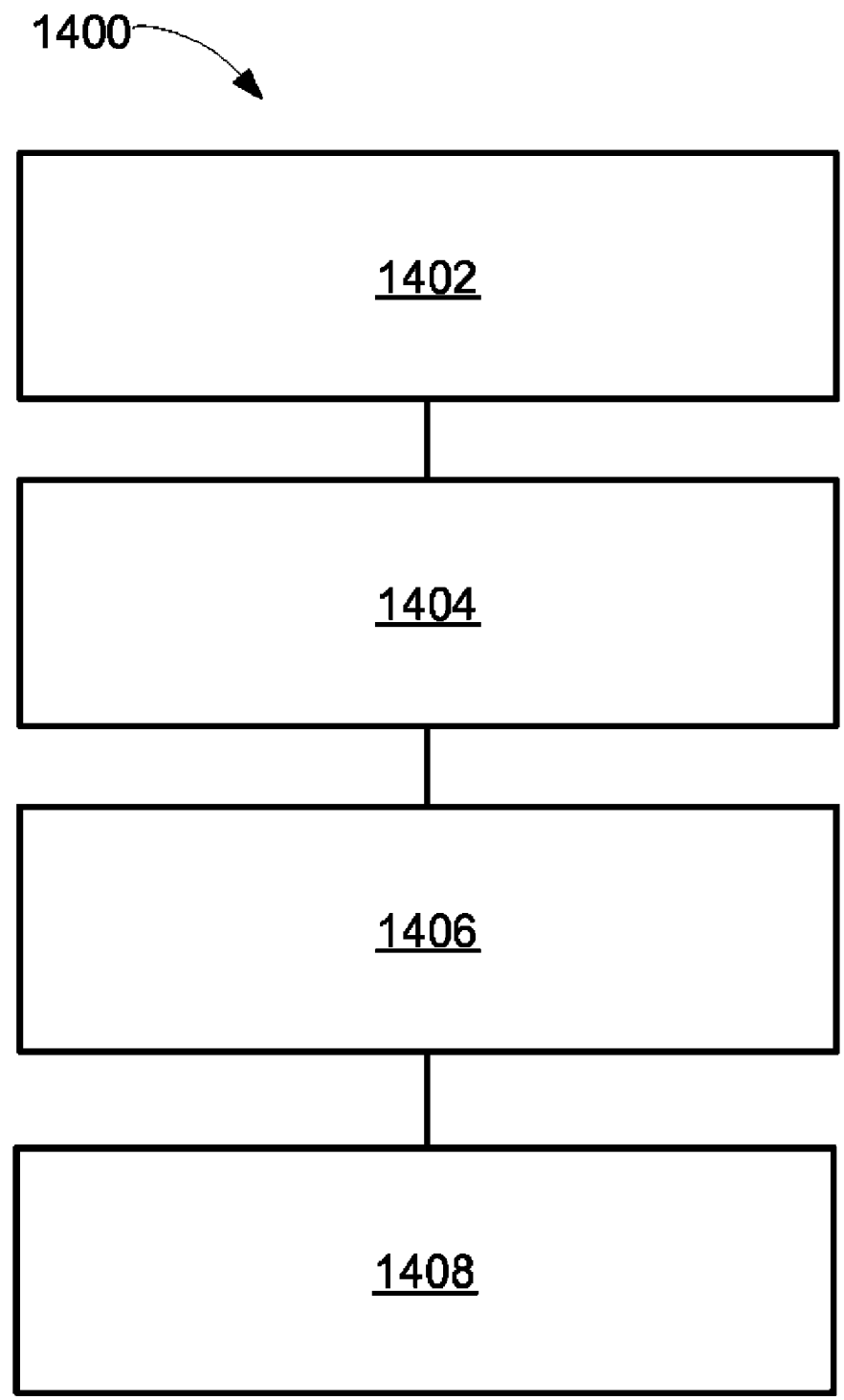
FIG. 14 is a flow chart of an integrated circuit stacking system for manufacturing an integrated circuit stacking system, in an embodiment of the present invention.

Referring now to FIG. 14, therein is shown a flow chart of an integrated circuit stacking system 1400 for manufacturing an integrated circuit stacking system 100, in an embodiment of the present invention. The system 1400 includes fabricating an integrated passive device including: providing a semiconductor substrate, forming an integrated inductor, a resistor block, or an integrated capacitor integrated on the semiconductor substrate, and forming contact pads, on the semiconductor substrate, coupled to the integrated inductor, the resistor block, or the integrated capacitor in a block 1402; positioning an integrated circuit die for maintaining an inductor spacing in a block 1404; mounting the integrated circuit die on the integrated passive device in a block 1406; and encapsulating the integrated circuit die and the integrated passive device in a block 1408.

It has been unexpectedly discovered that the integrated circuit stacking system with integrated passive components may produce a higher volume of precision analog circuits packaged with a digital or mixed signal chip.

It has been discovered that the present invention thus has numerous aspects.

A principle aspect that has been unexpectedly discovered is that the present invention simplifies the development of mixed signal functions by allowing the separation of passive components from the digital processing of an integrated circuit die. This allows the two devices to be fabricated using different process geometries.

Another aspect is that the integrated circuit stacking system provides better yield because both integrated circuit die and the integrated passive device can be tested prior to assembly. Since the analog functions do not have to be fabricated using a digital foundry process, the precision and reliability are enhanced.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit stacking system of the present invention furnishes important and heretofore unknown and unavailable solutions, capabilities, and functional aspects for developing integrated circuits that require large amounts of digital gates and precision analog functions. The resulting processes and configurations are straightforward, cost-effective, uncomplicated, highly versatile and effective, can be surprisingly and unobviously implemented by adapting known technologies, and are thus readily suited for efficiently and economically manufacturing mixed signal integrated circuit packaged devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit stacking system comprising:
fabricating an integrated passive device including:
providing a semiconductor substrate,
forming an integrated inductor, a resistor block, or an integrated capacitor integrated on the semiconductor substrate, and
forming contact pads, on the semiconductor substrate, coupled to the integrated inductor, the resistor block, or the integrated capacitor;
fabricating a printed circuit board for mounting the integrated passive device;
positioning an integrated circuit die for maintaining an inductor spacing;
mounting the integrated circuit die on the integrated passive device; and
encapsulating the integrated circuit die and the integrated passive device.

2. The method as claimed in claim 1 further comprising soldering a discrete component to the integrated passive device.

3. The method as claimed in claim 1 further comprising forming a polyimide layer over the integrated inductor, the resistor block, or the integrated capacitor.

4. The method as claimed in claim 1 in which positioning the integrated circuit die includes forming a polyimide spacer with an adhesive for maintaining the inductor spacing.

5. The method as claimed in claim 1 in which forming an integrated capacitor includes:
forming a first metal layer on the semiconductor substrate;
forming a silicide layer on the first metal layer;
depositing a dielectric layer over the silicide layer;
forming a polyimide layer, over the dielectric layer, having a capacitor opening and a contact opening; and
depositing a second metal layer in the capacitor opening and the contact opening.

6. A method of manufacturing an integrated circuit stacking system comprising:
fabricating an integrated passive device including:
providing a semiconductor substrate having a passivation layer,
forming an integrated inductor, on the semiconductor substrate, includes forming a conductive coil,
forming a resistor block on the semiconductor substrate, includes configuring a series connection, a parallel connection, or a combination thereof,
forming an integrated capacitor on the semiconductor substrate includes using a first metal layer, a second metal layer, and no other metal layers, and
forming contact pads, on the semiconductor substrate, coupled to the integrated inductor, the resistor block, or the integrated capacitor includes forming a first metal layer;
fabricating a printed circuit board for mounting the integrated passive device including coupling an electrical interconnect or a signal interconnect between the printed circuit board and the integrated passive device;
positioning an integrated circuit die for maintaining an inductor spacing including maintaining the inductor spacing in three dimensions;
mounting the integrated circuit die over the integrated passive device including applying an adhesive on the integrated circuit die and the integrated passive device; and
encapsulating the integrated circuit die and the integrated passive device including providing a molded body.

7. The method as claimed in claim 6 further comprising soldering a discrete component to the integrated passive device by providing a solder wettable contact.

8. The method as claimed in claim 6 further comprising forming a polyimide layer over the integrated inductor, the resistor block, or the integrated capacitor for providing a dielectric layer having a dielectric constant of less than 4.

9. The method as claimed in claim 6 in which positioning the integrated circuit die includes forming a polyimide spacer with an adhesive for maintaining the inductor spacing includes the polyimide spacer having a dielectric constant of less than 4.

10. The method as claimed in claim 6 in which forming an integrated capacitor includes:
forming a first metal layer over the semiconductor substrate, in which the first metal layer is copper;
forming a silicide layer on the first metal layer, including forming a layer of TaSi;
depositing a dielectric layer over the silicide layer, including depositing SiN;
forming a polyimide layer, over the dielectric layer, having a capacitor opening and a contact opening, including providing the area of the capacitor opening is proportional to the capacitor value; and
depositing a second metal layer in the capacitor opening and the contact opening, including forming a second plate of the integrated capacitor.

11. An integrated circuit stacking system comprising:
an integrated passive device including:
a semiconductor substrate, an integrated inductor, a resistor block, or an integrated capacitor integrated on the semiconductor substrate, and
contact pads, on the semiconductor substrate, coupled to the integrated inductor, the resistor block, or the integrated capacitor;
a printed circuit board with the intgrated passive device mounted thereon;
an integrated circuit die positioned to maintain an inductor spacing;
the integrated circuit die mounted on the integrated passive device; and
the integrated circuit die and the integrated passive device encapsulated.

12. The system as claimed in claim 11 further comprising a discrete component soldered to the integrated passive device.

13. The system as claimed in claim 11 further comprising a polyimide layer over the integrated inductor, the resistor block, or the integrated capacitor.

14. The system as claimed in claim 11 in which the integrated circuit die positioned by a polyimide spacer with an adhesive to maintain the inductor spacing.

15. The system as claimed in claim 11 in which an integrated capacitor includes:
a first metal layer on the semiconductor substrate;
a silicide layer on the first metal layer;
a dielectric layer over the silicide layer;
a polyimide layer, over the dielectric layer, includes a capacitor opening and a contact opening; and
a second metal layer deposited in the capacitor opening and the contact opening.

16. The system as claimed in claim 11 further comprising:
a passivation layer on the semiconductor substrate;
a conductive coil in the integrated inductor;
a series connection, a parallel connection, or a combination thereof;

a first metal layer, a second metal layer, and no other metal layers;

an adhesive on the integrated circuit die and the integrated passive device; and a molded body.

17. The system as claimed in claim 16 further comprising a discrete component soldered to the integrated passive device includes a solder wettable contact.

18. The system as claimed in claim 16 further comprising a polyimide layer over the integrated inductor, the resistor block, or the integrated capacitor includes a dielectric layer having a dielectric constant of less than 4.

19. The system as claimed in claim 16 in which the integrated circuit die positioned includes a polyimide spacer having a dielectric constant of less than 4.

20. The system as claimed in claim 16 in which forming an integrated capacitor includes:

a first metal layer over the semiconductor substrate, in which the first metal layer is copper;

a silicide layer on the first metal layer, including forming a layer of TaSi;

a dielectric layer over the silicide layer, including depositing SiN;

a polyimide layer, over the dielectric layer, includes a capacitor opening and a contact opening, in which the area of the capacitor opening is proportional to the capacitor value; and a second metal layer in the capacitor opening is a second plate of the integrated capacitor.

* * * * *